(12) United States Patent
Kodama

(10) Patent No.: US 10,315,854 B2
(45) Date of Patent: Jun. 11, 2019

(54) BOARD CONVEYANCE DEVICE AND CONVEYANCE BELT INSPECTION METHOD

(71) Applicant: FUJI CORPORATION, Chiryu (JP)

(72) Inventor: Toshihiro Kodama, Chiryu (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 15/507,483

(22) PCT Filed: Sep. 4, 2014

(86) PCT No.: PCT/JP2014/073357
§ 371 (c)(1),
(2) Date: Feb. 28, 2017

(87) PCT Pub. No.: WO2016/035190
PCT Pub. Date: Mar. 10, 2016

(65) Prior Publication Data
US 2017/0285545 A1    Oct. 5, 2017

(51) Int. Cl.
*B65G 43/02* (2006.01)
*H01L 21/67* (2006.01)
*H01L 21/677* (2006.01)
*H05K 13/00* (2006.01)
*H05K 13/08* (2006.01)

(52) U.S. Cl.
CPC ........ *B65G 43/02* (2013.01); *H01L 21/67259* (2013.01); *H01L 21/67288* (2013.01);
(Continued)

(58) Field of Classification Search
CPC ........ B65G 43/02; B65G 43/06; B65G 43/08; B65G 2203/0266; B65G 2203/0275; B65G 2203/042; B65G 2203/044; G03G 15/5054; G03G 15/6529; G03G 15/6591; G03G 2215/00611; G03G 2215/00616
(Continued)

(56) References Cited

U.S. PATENT DOCUMENTS

2003/0160156 A1   8/2003   Duhamel
2006/0192804 A1   8/2006   Nakata et al.

FOREIGN PATENT DOCUMENTS

CN    103991693 A    8/2014
JP    58-95023 A    8/1983
(Continued)

OTHER PUBLICATIONS

Extended European Search Report dated Aug. 7, 2017 in European Patent Application No. 14901377.3.
(Continued)

*Primary Examiner* — Benjamin R Schmitt
(74) *Attorney, Agent, or Firm* — Oblon, McClelland, Maier & Neustadt, L.L.P.

(57) ABSTRACT

A board conveyance device and conveyance belt inspection method that enable easy detection of a problem with conveyance belts. The board conveyance device includes: endless conveyance belts on which is set a conveyance path for conveying a board; a board sensor configured to detect the presence of the board at a specified detection position on the conveyance path; and a control section configured to, in a case in which the board is not being conveyed on the conveyance path, move the conveyance belts and determine a problem with the conveyance belts based on a detection result of the board sensor.

2 Claims, 3 Drawing Sheets

(52) U.S. Cl.
CPC ... *H01L 21/67706* (2013.01); *H05K 13/0061* (2013.01); *H05K 13/08* (2013.01); *H05K 13/081* (2018.08); *B65G 2203/0233* (2013.01); *B65G 2203/0266* (2013.01); *B65G 2203/0275* (2013.01); *B65G 2203/042* (2013.01); *B65G 2203/044* (2013.01); *B65G 2811/0673* (2013.01)

(58) Field of Classification Search
USPC ....... 198/810.02, 502.1; 399/9, 23, 303, 312
See application file for complete search history.

(56) References Cited

FOREIGN PATENT DOCUMENTS

| | | |
|---|---|---|
| JP | 2003-267624 A | 9/2003 |
| JP | 2005-14426 A | 1/2005 |
| JP | 2009-531604 A | 9/2009 |
| JP | 2014-157962 A | 8/2014 |
| WO | WO 2007/109896 | 10/2007 |
| WO | WO 2008-031648 A1 | 3/2008 |

OTHER PUBLICATIONS

International Search Report dated Oct. 28, 2014 in PCT/JP2014/073357 filed Sep. 4, 2014.

Office Action dated Mar. 5, 2018 in European Patent Application No. 14 901 377.3.

Japanese Office Action dated Aug. 7, 2018 for Japanese Application No. 2016-546262, and English translation thereof.

Chinese Office Action dated Aug. 1, 2018 for Chinese Patent Application No. 201480081598.X, and English translation thereof.

BOARD CONVEYANCE DEVICE AND CONVEYANCE BELT INSPECTION METHOD

TECHNICAL FIELD

The present application relates to a board conveyance device of an electronic component mounter, printer, or the like, and a conveyance belt inspection method for detecting a conveyance belt used for conveying a board.

BACKGROUND ART

Electronic component mounters are provided with a conveyance belt and a board sensor. A conveyance path of a board is set on the conveyance belt. The board sensor detects the presence of a board at a specified position on the conveyance path. Specifically, the board sensor is provided with a light emitter and a light receiver. The board sensor detects the board based on light from the light emitter to the light receiver being blocked.

CITATION LIST

Patent Literature

Patent literature 1: JP-A-2005-14426

SUMMARY

However, when the conveyance belt deteriorates over time, there are cases in which the conveyance belt is partially torn. In this case, the torn portion is raised from the surface of the conveyance belt. Due to this, the torn portion blocks the light of the light emitter of the board sensor. Therefore, the board sensor misdetects the torn portion as a board.

For this problem, an image forming device able to detect damage and dirtiness of a conveyance belt is disclosed in patent literature 1. A state detecting sensor is arranged on the carriage of the image forming device. The carriage is able to move on the top side of the conveyance belt in the direction extending along the conveyance belt. It is possible to detect dirtiness or damage on the conveyance belt by scanning the stationary conveyance belt using a carriage blockage state detection device.

However, with the image forming device of this patent literature, a state detecting sensor is run over the top side of the stationary conveyance belt. Thus, only the upper half of the conveyance belt can be detected at once. Accordingly, when inspecting the entire length of the conveyance belt, it is necessary to first run the detecting sensor over the upper half of the conveyance belt, then half-rotate the conveyance belt such that the upper half and lower half are switched, and then run the detecting sensor over the upper half (previously the lower half). This work is troublesome. Thus, an object of the present disclosure is to provide a board conveyance device and conveyance belt inspection method that enable easy detection of problems with a conveyance belt.

In order to solve the above problems, one embodiment is a board conveyance device including: an endless conveyance belt on which is set a conveyance path for conveying a board; a board sensor configured to detect the presence of the board at a specified detection position on the conveyance path; and a control section configured to, in a case in which the board is not being conveyed on the conveyance path, move the conveyance belt and determine a problem with the conveyance belt based on a detection result of the board sensor.

Examples of a problem location on a conveyance belt are frays (items of torn core material or surface layer material of the conveyance belt), bumps (where the conveyance belt is partially bowed), and gnarls (where the conveyance belt is partially protruding). That is, a problem location is a location at which at least a portion of the conveyance belt is protruding to the outside in the diameter direction, in other words, any location on the conveyance belt capable of being detected by the board sensor.

According to the present disclosure of a board conveyance device, it is possible to detect a problem of a conveyance belt using a conventional board sensor used for detecting a board. Further, when performing inspection of the conveyance belt, there is no need to move the board sensor. Thus, it is possible to easily detect a problem of a conveyance belt. Accordingly, it is possible to curtail cases of the board sensor misrecognizing a board and a problem location of a conveyance belt during board conveyance.

Further, according to the present disclosure of a board conveyance device, it is possible to inspect the conveyance belt using free time during which board conveyance is not performed. Thus, it is less likely that downtime due to conveyance belt inspection will occur during board production.

With respect to the embodiment above, the detection position may be set at only one location on the conveyance path, and the control device may, in a case in which the board is not being conveyed on the conveyance path, rotate the conveyance belt one revolution. According to this configuration, it is possible to inspect the entire length of the conveyance belt using a single detection location, that is, only a single board sensor. Therefore, it is possible to reduce the quantity of arranged board sensors.

With respect to the embodiment above, the detection position may be set at multiple locations on the conveyance path, with L0 being the entire length of the conveyance belt and L1 being the distance between, among the multiple locations set as detection positions, the detection position at the upstream end in the conveyance direction and the detection position at the downstream end in the conveyance direction, and the control device may, in a case in which the board is not being conveyed on the conveyance path, rotate the conveyance belt only L0-L1. According to this configuration, it is possible to inspect the entire length of the conveyance belt using multiple detection locations, that is, multiple board sensors. Thus, it is possible to reduce the time required for inspection of the conveyance belt.

With respect to the embodiment above, the conveyance belt may be arranged as a pair parallel in a direction intersecting the extending direction of the conveyance path, and the board sensor may be shared by the pair of conveyance belts. According to this configuration, inspection of the pair of conveyance belts can be performed at the same time using the shared board sensor. Thus, compared to a case in which conveyance belts are inspected individually, the time required for inspecting conveyance belts is reduced.

The embodiment above may be further provided with a display device configured to display a determination result of the control device. According to this configuration, an operator is able to visually recognize a problem with the conveyance belt.

To solve the above problems, another embodiment of a conveyance belt inspection method includes a detecting step for detecting the presence of a passing object at a specified detection position of a conveyance path by moving an endless conveyance belt in a case in which a board is not being conveyed at the conveyance path set by the endless conveyor belt; and a determining step for determining a problem with the conveyance belt based on the detection result from the detecting step.

As with the embodiment above, according to the other embodiment of a conveyance belt inspection method, it is possible to easily detect a problem of a conveyance belt. Further, it is possible to inspect the conveyance belt using free time during which board conveyance is not performed.

Advantageous Effects

According to the present disclosure, it is possible to provide a board conveyance device and conveyance belt inspection method that enable easy detection of problems with a conveyance belt.

DESCRIPTION OF EMBODIMENTS

Described below are embodiments of a board conveyance device and a conveyance belt inspection method of the present disclosure. In the embodiments below, the present disclosure of a board conveyance device is realized as an electronic component mounter.

Production Line

Figure 1:
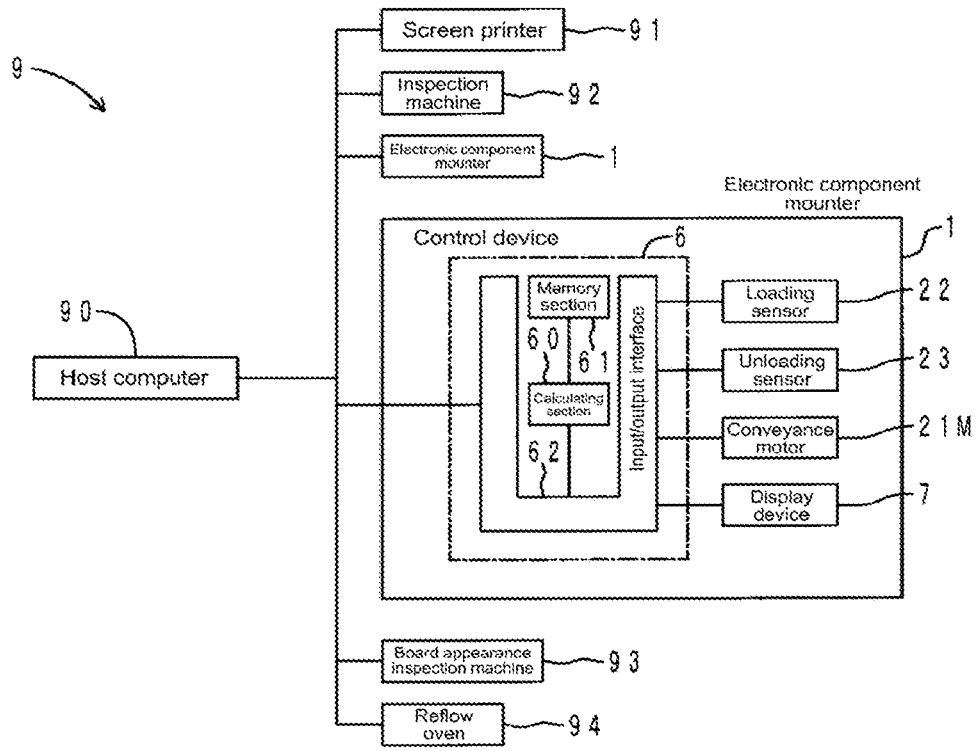
FIG. 1 is a block diagram of a production line in which an electronic component mounter that is an embodiment of the present disclosure is arranged.

Described first is the configuration of a production line in which an embodiment of an electronic component mounter is arranged. FIG. 1 is a block diagram of a production line in which the embodiment of an electronic component mounter is arranged. As shown in FIG. 1, arranged in a line in production line 9 are, from left (upstream) to right (downstream), screen printer 91, printing inspection machine 92, two electronic component mounters 1, board appearance inspection machine 93, and reflow oven 94. The right side electronic component mounter 1 is included in the concept of a "board conveyance device" of the present disclosure. Host computer 90 manages overall control of production line 9.

Screen printer 91 prints solder onto land sections of a circuit pattern of a board (not shown). Printing inspection machine 92 inspects the print condition of the solder. The two electronic component mounters 1 sequentially mount electronic components on a board according to the respective allocations of each electronic component mounter 1. Board appearance inspection machine 93 inspects the mounting condition of electronic components. Reflow oven 94 fixes the electronic components to the land sections of the circuit pattern with the solder.

Electronic Component Mounter

Figure 2:
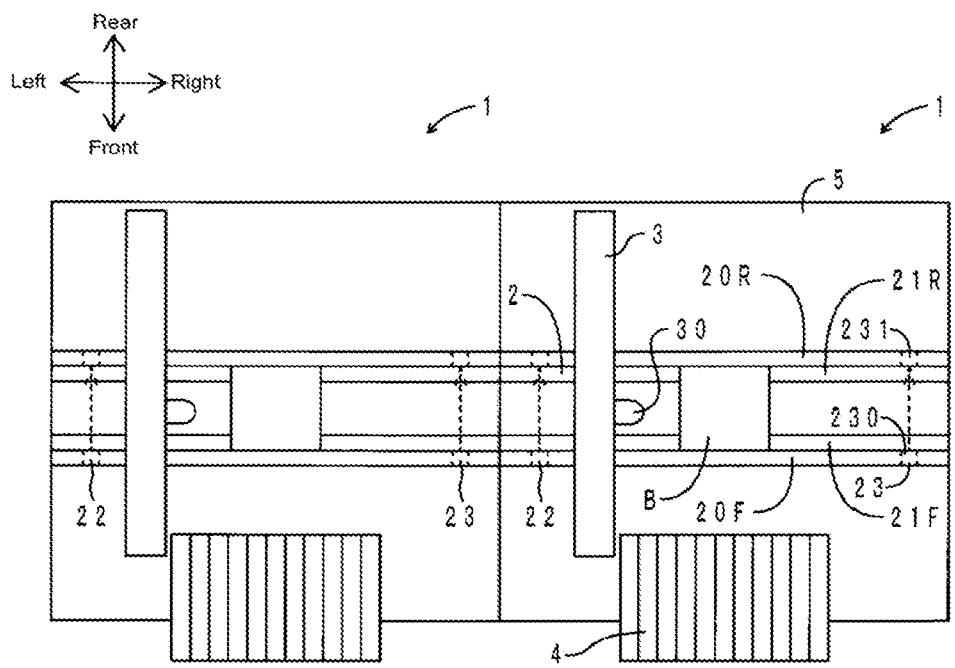
FIG. 2 is a top view of a portion of the production line of FIG. 1 in which two electronic component mounters are shown.

Described next is the configuration of the electronic component mounter of the present embodiment. FIG. 2 is a top view of a portion of the production line of FIG. 1 in which two electronic component mounters are shown. The configurations of the two electronic component mounters 1 are the same. As shown in FIGS. 1 and 2, electronic component mounter 1 is provided with conveyance conveyor 2, slider 3, component supply device 4, base 5, control device 6, and display device 7.

Slider 3, Component Supply Device 4, Base 5

Component supply device 4 is arranged at the front side of base 5. Slider 3 is arranged on the upper side of base 5. Slider 3 is capable of moving to the left and right with respect to base 5. Slider 3 is provided with suction nozzle 30. Suction nozzle 30 is capable of moving in the front and rear directions with respect to slider 3. Suction nozzle 30 is able to move freely in the front, rear, left, and right directions via an appropriate combination of left-right movement of slider 3 and front-rear movement of suction nozzle 30. Thus, suction nozzle 30 is able to transport an electronic component to specified coordinates of board B from component supply device 4.

Conveyance Conveyor 2

Conveyance conveyor 2 is provided with pair of front-rear support members 20F and 20R, pair of front-rear conveyance belts 21F and 21R, conveyance motor 21M, loading sensor 22, and unloading sensor 23. Unloading sensor 23 is included in the concept of "board sensor" of the present disclosure.

The pair of front-rear support members 20F and 20R each extend along the entire length in the left-right direction of base 5. The pair of conveyance belts 21F and 21R each extend along the entire length in the left-right direction of base 5. Front side conveyance belt 21F is arranged on front side support member 20F. Rear side conveyance belt 21F is arranged on rear side support member 20R. Conveyance belts 21F and 21R face each other in the front-rear direction. Board B is installed between conveyance belts 21F and 21R. Conveyance belts 21F and 21R are driven by conveyance motor 21M.

Figure 3:
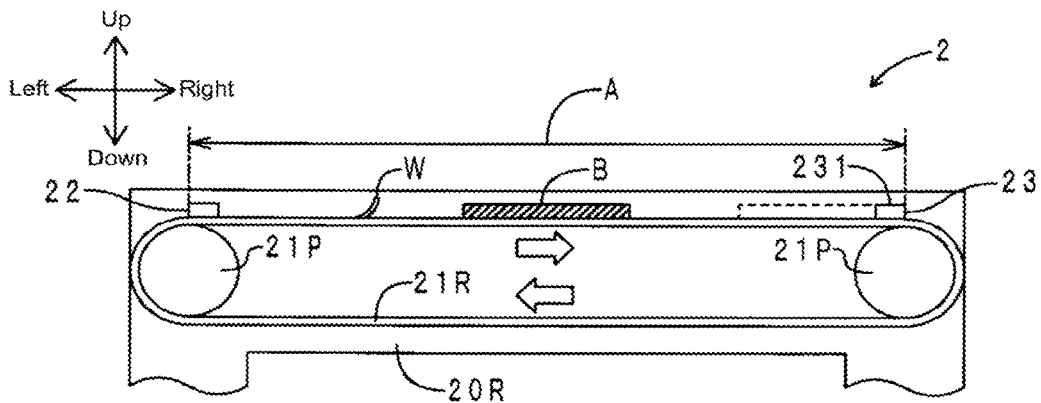
FIG. 3 is a front view of the conveyance belt of the rear side of the electronic component mounter.

FIG. 3 is a front view of the conveyance belt of the rear side of the electronic component mounter. As shown in FIG. 3, conveyance belt 21R is wound around two pulleys 21P at left and right ends. Conveyance belt 21R forms an elongated oval that extends in the left-right direction. Conveyance path A is set on the upper surface of conveyance belt 21R. Board B is conveyed along conveyance path A from the left side to the right side by the rotation of conveyance belts 21F and 21R.

Unloading sensor 23 is arranged at the right end (downstream end) of conveyance path A. That is, the detection position of unloading sensor 23 is set at the right end of conveyance path A. Unloading sensor 23 is a transmission type optical sensor. Unloading sensor 23 is provided with light emitter 230 and light receiver 231. As shown by the dotted line in FIG. 3, when the right edge of board B arrives between light emitter 230 and light receiver 231 (that is, arrives at the detection position), light emitted from light emitter 230 to light receiver 231 (refer to FIG. 2) is blocked. Based on the blocked light, unloading sensor 23 detects that "board B is present at the detection position".

Loading sensor 22 is arranged at the left end (upstream end) of conveyance path A. That is, the detection position of loading sensor 22 is set at the left end of conveyance path A. The configuration of loading sensor 22 is the same as that of unloading sensor 23.

Note that, each of screen printer 91, printing inspection machine 92, board appearance inspection machine 93, and reflow oven 94 shown in FIG. 1 is provided with conveyance conveyor 2. By each machine having conveyance conveyor 2, board B is conveyed along production 9 from the left side to the right side.

Control Device 6

As shown in FIG. 1, control device 6 is provided with calculating section 60, memory section 61, and input/output interface 62. The calculating section is a CPU (Central Processing Unit). Memory section 61 is provided with ROM (Read Only Memory) and RAM (Random Access Memory). Input/output interface 62 is electrically connected to loading sensor 22, unloading sensor 23, conveyance motor 21M, display device 7, host computer 90, screen printer 91, printing inspection machine 92, the other electronic component mounter 1, board appearance inspection machine 93, and reflow oven 94.

Conveyance Belt Inspection Method

Described next is the conveyance belt inspection method of the present embodiment. The conveyance belt inspection method is performed by the right side electronic component mounter 1 of the two electronic component mounters 1. Also, the conveyance belt inspection method uses unloading sensor 23. Further, in the conveyance belt inspection method, control device 6 performs inspection of the front and rear pair of conveyance belts 21F and 21R at the same time.

As shown in FIG. 3, as conveyance belts 21F and 21R age, there are cases in which a portion of conveyance belt 21F or 21R tears. That is, a whisker (error location) W may protrude from conveyance belt 21F or 21R. In this case, light from light emitter 230 of unloading sensor 23 is blocked by whisker W. Thus, unloading sensor 23 mistakenly detects whisker W for board B. To prevent this misdetection, electronic component mounter 1, at a specified cycle, performs a conveyance belt inspection method.

Figure 4:
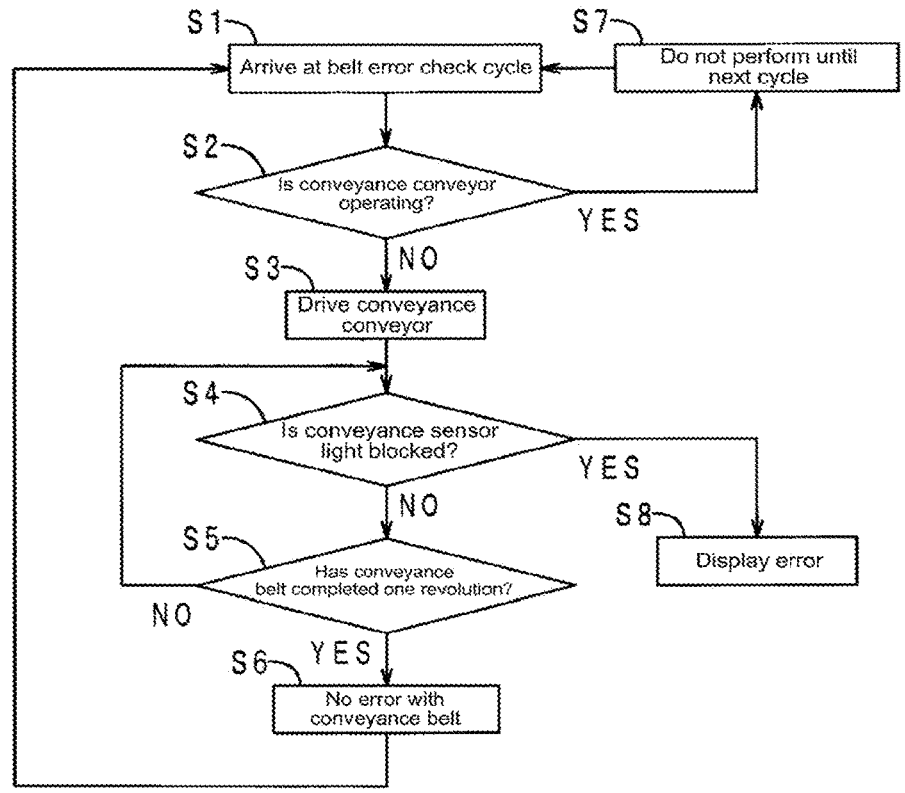
FIG. 4 is a flowchart of a conveyance belt inspection method that is an embodiment of the present disclosure.
Figure 5:
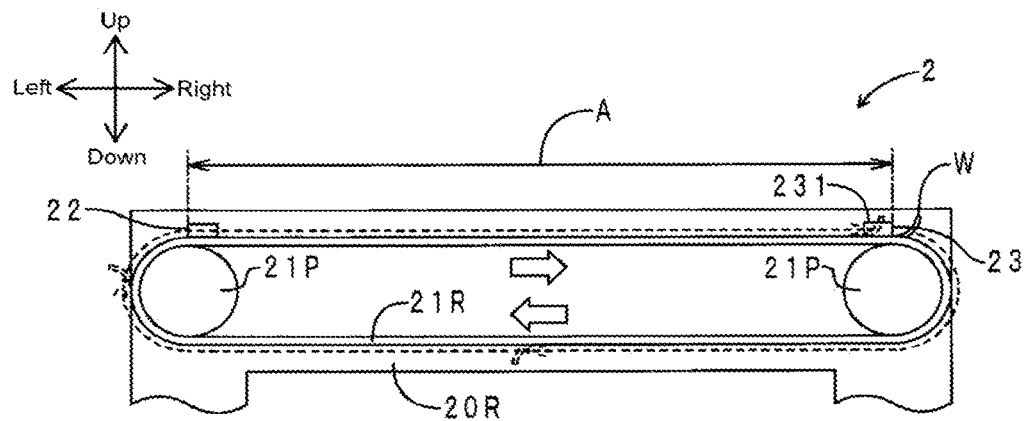
FIG. 5 is a front view of the conveyance belt of the rear side of the electronic component mounter as used in the conveyance belt inspection method.

The conveyance belt inspection method includes a detecting step, a determining step, and a display step. FIG. 4 is a flowchart of the conveyance belt inspection method of the present embodiment. FIG. 5 is a front view of the conveyance belt of the rear side of the electronic component mounter as used in the conveyance belt inspection method.

Inspection Step

In this steps, first, calculating section 60 shown in FIG. 1 confirms that the belt error checking cycle has arrived (S1 in FIG. 4, [also referred to as step 1, the same notation applying throughout]). Next, calculating section 60 checks whether conveyance conveyor 2 of the electronic component mounter 1 on the right side in FIG. 2 (the electronic component mounter 1 currently undergoing the conveyance belt inspection method) is operating based on the drive state of conveyance motor 21M (S2 in FIG. 4). That is, whether board conveyance is currently being performed at conveyance conveyor 2 of the right side electronic component mounter 1 is checked. In addition, calculating section 60 checks whether a board B is to be unloaded from the left side electronic component mounter 1 based on the signal of unloading sensor 23 of the electronic component mounter 1 on the left side in FIG. 2. That is, whether board loading is planned to conveyance conveyor 2 of the right side electronic component mounter 1 is checked.

In S2 of FIG. 4, in a case in which the right side electronic component mounter 1 is currently not conveying a board B, and there is no plan for a board B to be loaded to the right side electronic component mounter 1 in the near future, calculating section 60 operates conveyance conveyor 2 (S3 in FIG. 4). Calculating section 60 monitors whether light of light emitter 230 of unloading sensor 23 is being blocked (S4 of FIG. 4).

Conversely, in S2 of FIG. 4, in a case in which a board B is currently being conveyed in the right side electronic component mounter 1, calculating section 60 does not perform the conveyance belt inspection method until the next cycle (S7 in FIG. 4). Also, in a case in which a board B is planned to be conveyed in the right side electronic component mounter 1 in the near future, calculating section 60 does not perform the conveyance belt inspection method until the next cycle (S7 in FIG. 4).

Determining Step

In this step, calculating section 60 determines whether there is an error with conveyance belts 21F or 21R based on the monitoring result in S4 of FIG. 4. Specifically, as shown in FIG. 5, in a case in which light is blocked, calculating section 60 determines "error with conveyance belt 21F, 21R" (S8 in FIG. 4). On the other hand, if light is not blocked during one rotation of conveyance belts 21F and 21R (S5 in FIG. 4), calculating section 60 determines "no error with conveyance belt 21F, 21R".

Displaying Step

In this step, calculating section 60 displays the determination result (the determination result of "error with conveyance belt 21F, 21R") on display device 7 shown in FIG. 1. Specifically, an indication of a problem with conveyance belts 21F or 21R is displayed on a screen (not shown) of display device 7. In this manner control device 6 performs the conveyance belt inspection method.

Effects

Described next are the effects of electronic component mounter 1 and the conveyance belt inspection method of the present embodiment. As shown in FIGS. 1 and 4, according to electronic component mounter 1 and the conveyance belt inspection method of the present embodiment, it is possible to detect a problem with conveyance belts 21F and 21R by using a conventional unloading sensor 23 used for detecting board B. Also, when inspecting conveyance belts 21F and 21R, there is no need to move unloading sensor 23. Thus, it is possible to easily detect a problem of conveyance belts 21F and 21R. It follows that, during conveyance of board B, it is possible to curtail unloading sensor 23 misdetecting a problem location (such as whisker W) of conveyance belts 21F and 21R and a board B. Also, compared to a case in which a dedicated sensor for inspecting conveyance belts 21F and 21R is arranged separate to unloading sensor 23, it is possible to reduce the quantity of sensors arranged.

Also, according to electronic component mounter 1 and the conveyance belt inspection method of the present embodiment, it is possible to inspect conveyance belts 21F and 21R using free time during which board B is not being conveyed. Thus, it is less likely that downtime due to inspection of conveyance belts 21F and 21R will occur during production time of board B.

Also, according to electronic component mounter 1 and the conveyance belt inspection method of the present embodiment, the detection position (position of unloading sensor 23) is set at only one location on conveyance path A. Thus, it is possible to inspect the entire length of the conveyance belts 21F and 21R using a single detection location, that is, only a single unloading sensor 23. Therefore, it is possible to reduce the quantity of arranged unloading sensors 23.

Further, the quantity of rotations of conveyance belts 21F and 21R during inspection of conveyance belts 21F and 21R is only one. Thus, compared to a case in which conveyance belts 21F and 21R are rotated multiple times, the time required for inspection of conveyance belts 21F and 21R is shortened.

Further, according to electronic component mounter 1 and the conveyance belt inspection method of the present embodiment, unloading sensor 23 is shared between the pair of conveyance belts 21F and 21R. Thus, inspection of the pair of conveyance belts 21F and 21R can be performed at the same time by the shared unloading sensor 23. Thus, compared to a case in which conveyance belts 21F and 21R are inspected separately, the time required for inspection of conveyance belts 21F and 21R is shortened. Also, electronic component mounter 1 of the present embodiment is provided with display device 7. Thus, an operator can visually recognize that there is a problem with conveyance belts 21F or 21R.

Other Embodiments

Described above is an embodiment of a board conveyance device and a conveyance belt inspection method of the present invention. However, embodiments are not limited to the above-described embodiment. Those skilled in the art may implement various modified or improved embodiments.

Figure 6:
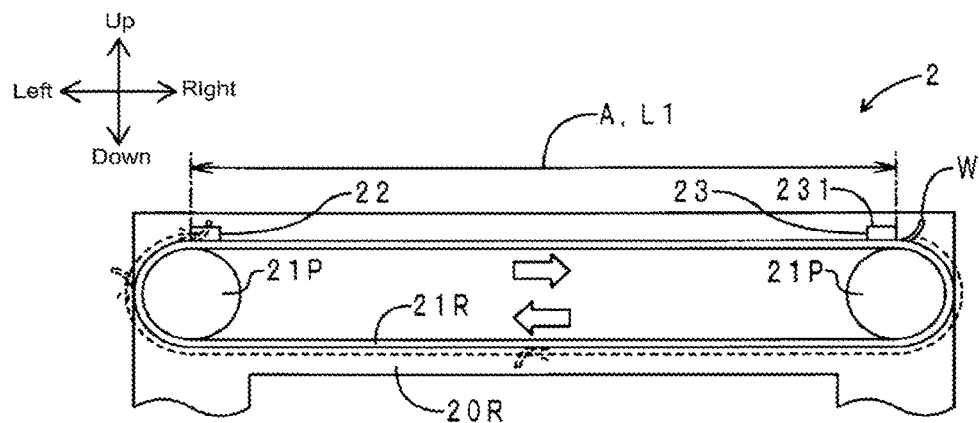
FIG. 6 is a front view of a conveyance belt of the rear side of the electronic component mounter for an alternative embodiment.

FIG. 6 is a front view of a conveyance belt of the rear side of the electronic component mounter for an alternative embodiment. Note that, the same reference signs are used for elements corresponding to those shown in FIG. 3. In this embodiment, loading sensor 22 and unloading sensor 23 are included in the concept of "board sensor" of the present disclosure.

When performing the conveyance belt inspection method, control device 6 shown in FIG. 1 performs inspection of conveyance belts 21F and 21R using detection positions at both the left and right ends of conveyance path A. Control device 6, in S5 shown in FIG. 4, rotates conveyance belts 21F and 21R by L0-L1, L0 being the entire length of each conveyance belt 21F and 21R, and L1 being the distance between the detection positions at the left and right ends of conveyance path A (that is, the entire length of conveyance path A). By doing this, it is possible to inspect the entire length L0 of conveyance belts 21F and 21R using two detection locations, that is, two board sensors (loading sensor 22 and unloading sensor 23). For example, as shown in FIG. 6, in a case in which there is a whisker W downstream and adjacent to unloading sensor 23, the whisker W can be detected by loading sensor 22 without having to rotate conveyance belts 21F and 21R an entire rotation. In this way, according to the board conveyance device of the present embodiment, it is possible to shorten the rotation distance of conveyance belts 21F and 21R during S5 of FIG. 4. Thus, it is possible to reduce the time required for inspection of conveyance belts 21F and 21R.

Also, in a case in which light is blocked in S4 of FIG. 4, control device 6 shown in FIG. 1 is able to confirm that there is an item passing through at the detection position of the board sensors (loading sensor 22 and unloading sensor 23). However, it is not possible to identify what the item passing through is. For this, in a case in which light is blocked in S4 of FIG. 4 (that is, there is an item passing through), with light being blocked as a rotation starting condition, conveyance belts 21F and 21R may be rotated one revolution. By doing this, the target portion of the item passing through of conveyance belts 21F and 21R passes past the detection positions again. If light is blocked once again, the cause of the total of two cases of light being blocked may be supposed to be the conveyance belt 21F or 21R itself. In this case, control device 6 determines that there is a problem with conveyance belt 21F or 21R. Conversely, if light is not blocked, it may be supposed that the cause of light being blocked previously was not conveyance belt 21F or 21R. For example, foreign matter loaded on conveyance belt 21F or 21R may be supposed to have fallen off due to its own weight as conveyance belts 21F and 21R were rotated. In this case, control device 6 may determine that there is no problem with conveyance belts 21F and 21R. In this way, by making light being blocked as a rotation starting condition and rotating conveyance belts 21F and 21R one revolution, control device 6 is able to determine whether the cause of light being blocked is one of conveyance belts 21F or 21R.

Also, in a case in which light is blocked in S4 of FIG. 4, control device 6 shown in FIG. 1 may stop conveyance belts 21F and 21R. By doing this, an operator is able to check the problem location of conveyance belts 21F and 21R by visually checking the area around unloading sensor 23.

In S2 of FIG. 4, the method determining whether a board is planned to be loaded to conveyance conveyor 2 of the right side electronic component mounter 1 (the electronic component mounter 1 currently undergoing the conveyance belt inspection) shown in FIG. 2 in the near future is not particularly limited. For example, whether a board is planned to be loaded in the near future may be determined based on a signal of unloading sensor 23 of the left side electronic component mounter 1 shown in FIG. 2 (the electronic component mounter 1 upstream of the electronic component mounter 1 currently undergoing the conveyance belt inspection method). Also, the presence of a board B in the left side electronic component mounter 1 may be checked via communication between the right side electronic component mounter 1 and the left side electronic component mounter 1. Then, in a case in which there is a board B in the left side electronic component mounter 1, it may be determined that "in the near future, a board B is planned to loaded to conveyance conveyor 2 of the right side electronic component mounter 1".

The display contents for "error" on display device 7 shown in FIGS. 1 and S8 of FIG. 4 is not particularly limited. A message using characters, diagrams, symbols, or the like may be used. Also, a flashing display, or reversing black and white may be used. Also, instead of display device 7, a lamp, siren, buzzer, or the like may be used. That is, a sending device that sends any signal that conveys the information "error" may be electrically connected to control device 6. Also, instead of information indicating "error", display device 7 may display information related to the exchange of conveyance belts 21F and 21R, or the aging of conveyance belts 21F and 21R.

The type of board sensor (loading sensor 22 and unloading sensor 23) is not particularly limited. A photoelectric sensor, an ultrasonic sensor, or the like may be used. The light source of light emitter 230 is not particularly limited. An LED (Light-Emitting Diode), a semiconductor laser diode, or the like may be used. The receiver element of light receiver 231 is not particularly limited. A photodiode, a phototransistor, or the like may be used. The type of light emitted by light emitter 230 is not particularly limited. Visible light, infrared light, laser, or the like may be used.

The detecting step, the determining step and the displaying step of the conveyance belt inspection method may be performed at the same time. That is, while performing the detecting step, the determining step and the displaying step may be performed according to the signal from unloading sensor 23. Also, the determining step and the displaying step may be performed after the detecting step has been completed.

In the embodiment above, the right side electronic component mounter 1 was used as the board conveyance device of the present disclosure. However, screen printer 91, printing inspection machine 92, left side electronic component mounter 1, board appearance inspection machine 93, or reflow oven 94 shown in FIG. 1 may be used as the board conveyance device. Also, the conveyor linking these machines may be used as the board conveyance device.

A control device other than control device 6 of the board conveyance device provided with conveyance belts 21F and 21R that are the inspection targets of the conveyance belt inspection method may perform the conveyance belt inspection method. For example, inspection of conveyance belts 21F and 21R of the right side electronic component mounter 1 may be performed by a control device of host computer 90 shown in FIG. 1, a control device of screen printer 91, a control device of printing inspection machine 92, a control device of the left side electronic component mounter 1, a control device of board appearance inspection machine 93, a control device of reflow oven 94, a mobile terminal such as a smartphone, a personal computer, or the like.

Also, the control device of host computer 90 shown in FIG. 1 may decide the timing of the performance of inspection and the board conveyance device (single or multiple devices) on which to perform inspection from screen printer 91, printing inspection machine 92, left side electronic component mounter 1, right side electronic component mounter 1, board appearance inspection machine 93, and reflow oven 94 based on the position and distribution of board B in the entire production line 9. Further, an operator may decide the board conveyance device on which to perform inspection and the timing of the performance of inspection. For example, inspection may be performed in the morning (before starting production of board B), at lunch time (during a work break), when changeover during which the type of board B being produced is changed, or the like.

Also, the position of the board sensor (loading sensor 22 and unloading sensor 23) and the detection position of the board sensor do not have to match (or be close). For example, the board sensor may be arranged at a position separated from the detection position. That is, so long as the presence of an item passing through at the detection position can be detected by the board sensor. Also, the quantity and position on conveyance path A of the detection position is not particularly limited. And, inspection of a single conveyance belt 21F (or 21R) may be performed by a single board sensor. Further, the rotation direction of conveyance belts 21F and 21R during inspection is not particularly limited. For example, the rotation direction may be the opposite direction to the conveyance direction of board B. Also, the rotation quantity of conveyance belts 21F and 21R during inspection is not particularly limited. The rotation quantity may be less than a full revolution. Or, the rotation quantity may be a multiple number.

REFERENCE SIGNS LIST

1: electronic component mounter (board conveyance device); 2: conveyance conveyor; 20F: support member; 20R: support member; 21: conveyance belt; 21M conveyance motor; 21P: pulley; 21R: conveyance belt; 22: loading sensor (board sensor); 23: unloading sensor (board sensor); 230: light emitter; 231: light receiver; 3: slider; 30: suction nozzle; 4: component supply device; 5: base; 6: control device; 60: calculating section; 61: memory section; 62: input/output interface; 7: display device; 9: production line; 90: host computer; 91: screen printer; 92: printing inspection machine; 93: board appearance inspection machine; 94: reflow oven; A: conveyance path; B: board; W: whisker

The invention claimed is:
1. A board conveyance device comprising:
an endless conveyance belt on which a conveyance path is set for conveying a board;
a conveyance motor configured to drive the endless conveyance belt;
a board sensor configured to detect the presence of the board and a passing object at a specified detection position on the conveyance path when a light emitted by a light source is blocked; and
a control section configured to
check whether the board is being conveyed on the conveyance path based on a drive state of the conveyance motor, and in a case in which the control section determines the board is not being conveyed on the conveyance path, move the conveyance belt, and
if the board sensor detects the presence of the passing object because the light is blocked, further rotate the conveyance belt one revolution with the light being blocked as a rotation starting condition, and if the light is blocked once again, determine a problem with the conveyance belt based on a detection result of the board sensor.
2. The board conveyance device according to claim 1, further provided with
a display device configured to display the determination result of the control section.

* * * * *